(12) United States Patent
Venkatagiriyappa et al.

(10) Patent No.: US 10,682,732 B2
(45) Date of Patent: Jun. 16, 2020

(54) ENGINEERED POLYMER-BASED ELECTRONIC MATERIALS

(71) Applicant: Alpha Assembly Solutions Inc., Waterbury, CT (US)

(72) Inventors: Ramakrishna Hosur Venkatagiriyappa, Bangalore (IN); Morgana De Avila Ribas, Bangalore (IN); Barun Das, Bangalore (IN); Harish Hanchina Siddappa, Bangalore (IN); Sutapa Mukherjee, Bangalore (IN); Siuli Sarkar, Bangalore (IN); Bawa Singh, Marlton, NJ (US); Rahul Raut, Sayreville, NJ (US); Ranjit Pandher, Plainsboro, NJ (US)

(73) Assignee: ALPHA ASSEMBLY SOLUTIONS INC., Somerset, NJ (US)

( * ) Notice: Subject to any disclaimer, the term of this patent is extended or adjusted under 35 U.S.C. 154(b) by 62 days.

(21) Appl. No.: 15/562,195

(22) PCT Filed: Mar. 31, 2016

(86) PCT No.: PCT/GB2016/050910
§ 371 (c)(1),
(2) Date: Sep. 27, 2017

(87) PCT Pub. No.: WO2016/156853
PCT Pub. Date: Oct. 6, 2016

(65) Prior Publication Data
US 2018/0056455 A1 Mar. 1, 2018
US 2019/0143461 A9 May 16, 2019

(30) Foreign Application Priority Data

Apr. 1, 2015 (IN) .............................. 930/DEL/2015

(51) Int. Cl.
*C09J 163/00* (2006.01)
*C08L 63/00* (2006.01)
(Continued)

(52) U.S. Cl.
CPC ........ *B23K 35/3613* (2013.01); *B23K 1/0016* (2013.01); *B23K 1/20* (2013.01); *B23K 35/00* (2013.01); *B23K 35/025* (2013.01); *B23K 35/0244* (2013.01); *B23K 35/3602* (2013.01); *C08K 3/013* (2018.01); *C08K 3/04* (2013.01); *C08K 3/042* (2017.05); *C08K 5/00* (2013.01); *C08K 5/549* (2013.01); *C08K 7/02* (2013.01); *H01L 23/295* (2013.01); *H01L 23/296* (2013.01); *H01L 24/13* (2013.01); *H01L 24/29* (2013.01); *H01L 24/81* (2013.01); *H01L 24/83* (2013.01); *B23K 2101/42* (2018.08); *H01L 24/11* (2013.01); *H01L 24/27* (2013.01); *H01L 2224/1131* (2013.01); *H01L 2224/1132* (2013.01); *H01L 2224/1141* (2013.01); *H01L 2224/11312* (2013.01); *H01L 2224/11418* (2013.01); *H01L 2224/11422* (2013.01); *H01L 2224/131* (2013.01); *H01L 2224/1301* (2013.01); *H01L 2224/133* (2013.01); *H01L 2224/1329* (2013.01); *H01L 2224/1349* (2013.01); *H01L 2224/13111* (2013.01); *H01L 2224/13144* (2013.01); *H01L 2224/13311* (2013.01); *H01L 2224/13339* (2013.01); *H01L 2224/13344* (2013.01); *H01L 2224/13347* (2013.01); *H01L 2224/13386* (2013.01); *H01L 2224/13387* (2013.01); *H01L 2224/13393* (2013.01); *H01L 2224/13439* (2013.01); *H01L 2224/13444* (2013.01); *H01L 2224/13447* (2013.01); *H01L 2224/13486* (2013.01); *H01L 2224/13487* (2013.01); *H01L 2224/13499* (2013.01); *H01L 2224/2731* (2013.01); *H01L 2224/2732* (2013.01); *H01L 2224/2741* (2013.01); *H01L 2224/27312* (2013.01); *H01L 2224/27418* (2013.01); *H01L 2224/27422* (2013.01); *H01L 2224/27436* (2013.01);
(Continued)

(58) Field of Classification Search
None
See application file for complete search history.

(56) References Cited

U.S. PATENT DOCUMENTS

2014/0018475 A1* 1/2014 Falkner .............. C08G 59/1438
523/458
2014/0187687 A1 7/2014 Ji et al.
(Continued)

FOREIGN PATENT DOCUMENTS

CN 102443247 5/2012
CN 103614098 3/2014
(Continued)

*Primary Examiner* — Michael J Feely
(74) *Attorney, Agent, or Firm* — Carmody Torrance Sandak & Hennessey LLP

(57) ABSTRACT

A composition for use in an electronic assembly process, the composition comprising a filler dispersed in an organic medium, wherein:
  the organic medium comprises a polymer;
  the filler comprises one or more of graphene, functionalized graphene, graphene oxide, a polyhedral oligomeric silsesquioxane, graphite, a 2D material, aluminum oxide, zinc oxide, aluminum nitride, boron nitride, silver, nano fibers, carbon fibers, diamond, carbon nanotubes, silicon dioxide and metal-coated particles, and the composition comprises from 0.001 to 40 wt. % of the filler based on the total weight of the composition.

18 Claims, 2 Drawing Sheets

(51) Int. Cl.
*C08K 3/00* (2018.01)
*C08K 3/04* (2006.01)
*C08K 3/34* (2006.01)
*C08K 5/54* (2006.01)
*C08K 9/00* (2006.01)
*B23K 35/36* (2006.01)
*B23K 1/00* (2006.01)
*B23K 35/02* (2006.01)
*H01L 23/29* (2006.01)
*H01L 23/00* (2006.01)
*C08K 5/00* (2006.01)
*C08K 3/013* (2018.01)
*B23K 1/20* (2006.01)
*C08K 7/02* (2006.01)
*B23K 35/00* (2006.01)
*C08K 5/549* (2006.01)
*B32B 27/38* (2006.01)
*B23K 101/42* (2006.01)

(52) U.S. Cl.
CPC ............... *H01L 2224/27602* (2013.01); *H01L 2224/293* (2013.01); *H01L 2224/2929* (2013.01); *H01L 2224/2939* (2013.01); *H01L 2224/2949* (2013.01); *H01L 2224/29294* (2013.01); *H01L 2224/29311* (2013.01); *H01L 2224/29339* (2013.01); *H01L 2224/29344* (2013.01); *H01L 2224/29347* (2013.01); *H01L 2224/29386* (2013.01); *H01L 2224/29387* (2013.01); *H01L 2224/29393* (2013.01); *H01L 2224/29439* (2013.01); *H01L 2224/29444* (2013.01); *H01L 2224/29447* (2013.01); *H01L 2224/29486* (2013.01); *H01L 2224/29487* (2013.01); *H01L 2224/29499* (2013.01); *H01L 2224/73204* (2013.01); *H01L 2224/8184* (2013.01); *H01L 2224/81856* (2013.01); *H01L 2224/81862* (2013.01); *H01L 2224/81874* (2013.01); *H01L 2224/8321* (2013.01); *H01L 2224/83851* (2013.01); *H01L 2224/83856* (2013.01); *H01L 2224/83862* (2013.01); *H01L 2224/83874* (2013.01); *H01L 2924/014* (2013.01); *H01L 2924/12041* (2013.01); *H01L 2924/351* (2013.01); *H01L 2924/3841* (2013.01)

(56) References Cited

U.S. PATENT DOCUMENTS

| | | | |
|---|---|---|---|
| 2014/0273431 A1* | 9/2014 | Sasagawa | B23K 26/142 438/618 |
| 2015/0072478 A1* | 3/2015 | Morganelli | H01L 23/293 438/124 |
| 2017/0135227 A1* | 5/2017 | Ramakrishna | B23K 1/203 |

FOREIGN PATENT DOCUMENTS

| | | | |
|---|---|---|---|
| CN | 103614098 B | 11/2016 | |
| JP | 62-093096 | 4/1987 | |
| JP | 2001-517153 | 10/2001 | |
| JP | 2013043931 A | 3/2013 | |
| JP | 2014-130817 | 7/2014 | |
| JP | 2015-006985 | 1/2015 | |
| JP | 2015-052051 | 3/2015 | |
| WO | 97/07542 A1 | 2/1997 | |
| WO | WO-2015193684 A1 * | 12/2015 | ........... B23K 1/0016 |

* cited by examiner

ENGINEERED POLYMER-BASED ELECTRONIC MATERIALS

The invention relates to a polymer composition for use in the manufacture of electronic components and devices as well as in electronic assembly and packaging.

Surface-mount technology (SMT) is a method for producing electronic circuits in which the components are mounted or placed directly onto the surface of printed circuit boards (PCBs). An electronic device so made is called a surface-mount device (SMD). In the electronics industry SMT has largely replaced the through-hole technology construction method of fitting components with wire leads into holes in the circuit board. Both technologies can be used on the same board for components not suited to surface mounting such as large transformers and heat-sinked power semiconductors. An SMT component is usually smaller than its through-hole counterpart because it has either smaller leads or no leads at all. It may have short pins or leads of various styles, flat contacts, a matrix of solder balls (BGAs), or terminations on the body of the component.

Where components are to be placed, the printed circuit board normally has flat, usually tin-lead, silver, or gold plated copper pads without holes, called solder pads. Solder paste, a sticky mixture of flux and tiny solder particles, is first applied to all the solder pads with a stainless steel or nickel stencil using a screen printing process. It can also be applied by a jet-printing mechanism, similar to an inkjet printer. After pasting, the boards then proceed to the pick-and-place machines, where they are placed on a conveyor belt. The components to be placed on the boards are usually delivered to the production line in either paper/plastic tapes wound on reels or plastic tubes. Some large integrated circuits are delivered in static-free trays. Numerical control pick-and-place machines remove the parts from the tapes, tubes or trays and place them on the PCB. The boards are then conveyed into the reflow soldering oven. They first enter a pre-heat zone, where the temperature of the board and all the components is gradually, uniformly raised. The boards then enter a zone where the temperature is high enough to melt the solder particles in the solder paste, bonding the component leads to the pads on the circuit board. The surface tension of the molten solder helps keep the components in place, and if the solder pad geometries are correctly designed, surface tension automatically aligns the components on their pads. There are a number of techniques for reflowing solder. One is to use infrared lamps; this is called infrared reflow. Another is to use a hot gas convection. Another technology which is becoming popular again is special fluorocarbon liquids with high boiling points which use a method called vapor phase reflow.

Solder joints in electronic devices are susceptible to thermomechanical fatigue. This is because the work pieces joined by a solder joint typically have different coefficients of thermal expansion (CTE). In addition, it is desirable that, solder joints in electronic devices exhibit high mechanical strength and high resistance to drop shock. Accordingly, such joints are typically encapsulated with materials known as "underfills". Underfills are typically composites of organic polymers and inorganic fillers (e.g. silica). Pre-cured and post-cured properties of such underfills are at the extreme ends of the materials spectrum. The pre-cured underfill is expected to flow freely like water under the smallest gaps (typically less than 25 microns). The cured underfill is expected to assume rock-hard, inorganic-like properties, while bonding strongly to inorganic silicon and organic substrates. Increasing the amount of filler may improve the mechanical properties of the underfill. However, this may also increase the viscosity of the composition. Accordingly, there is a need for underfill materials (or alternatives to underfill materials) exhibiting reduced viscosity in the uncured state and improved mechanical properties in the cured state. Furthermore, conventional underfill materials cannot be cured using standard SMT reflow processes and profiles. Accordingly, separate and distinct processing steps are required when underfills are used, thereby increasing the complexity of the process.

Among LED chip structures, flip-chip is the fastest growing chip structure and is gaining market share from both lateral structure and vertical structure LEDs. The flip-chip LED penetration is expected to grow from <5% in 2014 to >20% by 2020. Further, there is also significant growth in flip chip CSP, i.e. (Level 2) assembly, where the CSP package has essentially the same footprint as the flip chip LED die, thus reducing the package cost and footprint for the same or enhanced power and lumen output.

For flip chip LED assembly in package, there is an increasing trend to use SAC based solder pastes to create the flip chip interconnects between the flip chip LED die and the package substrate. Silver epoxy or sintered metal materials can also be used to create the flip chip interconnects between the flip chip LED die and the package substrate.

There are significant issues faced by assemblers of flip chip LEDs on package substrate (Level 1 Attach) as well as assemblers of CSP LEDs (Level 2). After reflow, if a no-clean solder paste is used, flux residue is typically left behind on the substrate around and between anode and cathode solder pads. If reflow is not properly done, this can result in potential shorts between the anode and cathode solder interconnects in operation, especially in the presence of moisture, due to the high current passing through the interconnects and the voltage bias that is applied between the anode and cathode. This same issue could occur if silver epoxy or sintered metal materials are used to create the flip chip interconnects between the flip chip LED die and the package substrate, or the CSP LED package and the board. If the LED packager or assembler contemplates using commonly available underfill materials, a separate curing step is required to cure the underfill (separate from the solder reflow step), resulting in low throughput and increased costs. Further, flip chip LED or CSP LED assembly with solder paste can result in die or package float and tilt.

The present invention seeks to tackle at least some of the problems associated with the prior art or at least to provide a commercially acceptable alternative solution thereto.

The present invention provides a composition for use in an electronic assembly process, the composition comprising a filler dispersed in an organic medium, wherein:
  the organic medium comprises a polymer;
  the filler comprises one or more of graphene, functionalized graphene, graphene oxide, polyhedral oligomeric silsesquioxane, graphite, a 2D material, aluminum oxide, zinc oxide, aluminum nitride, boron nitride, silver, nano fibers, carbon fibers, diamond, carbon nanotubes, silicon dioxide and metal-coated particles, and
  the composition comprises from 0.001 to 40 wt. % of the filler based on the total weight of the composition.

Each aspect or embodiment as defined herein may be combined with any other aspect(s) or embodiment(s) unless clearly indicated to the contrary. In particular, any features indicated as being preferred or advantageous may be combined with any other feature indicated as being preferred or advantageous.

The term "graphene" used herein encompasses a single atomic plane of graphite (referred to as monolayer graphene), or a few layers graphene, or multilayers of graphene or graphene platelets.

The term "2D materials" used herein encompasses material having two dimensions that are proportionally much larger than a third dimension. Examples of such materials are boron nitride, molybdenum disulphide, tungsten diselenide, transition metals di-chalcogenides, nickel HITP (2,3,6,7,10,11-hexaiminotriphenylene), germanane, graphane, phosphorene, stanene, silicine, borophene, graphyne, fluorinated graphene and 2D synthesized metals such as Palladium and Rhodium.

The term "graphene oxide" used herein encompasses the molecular sheets obtained when graphite oxide is dispersed in a basic medium. Graphene oxide comprises graphene sheets with oxygen-containing functional groups on the surface thereof.

The term "funtionalised graphene" used herein encompasses graphene having one or more functional groups on the surface thereof.

The term "polyhedral oligomeric silsesquioxanes" (POSS) used herein encompasses nanostructures with the empirical formula $RSiO_{1.5}$, where R may be a hydrogen atom or an organic functional group such as, for example, alkyl, alkylene, acrylate, hydroxyl or epoxide. POSS may be referred to as a silica nanoparticle consisting of a silica cage core, as well as other organic functional groups attached to the corners of the cage. POSS consists of both organic and inorganic matter with an inner core of inorganic silicon and oxygen and an outer layer of organic constituents, which could be either polar or nonpolar. Silsesquioxanes structures can be random, ladder, cage or partial cage. POSS nanostructures have diameters in the range 1-3 nm and, hence, may be considered as the smallest existing silica particles. The molecular structure of a polyhedral oligomeric silsesquioxane is as follows:

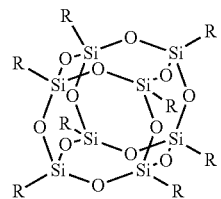

The term "surface-mount technology" (SMT) used herein encompasses a method for producing electronic circuits in which the components are mounted or placed directly onto the surface of printed circuit boards (PCBs).

The term "surface-mount process" used herein refers to a process using SMT.

The term "curable" used herein means that the species to which it refers (i.e. composition or polymer) is capable of undergoing cross-linking of polymer chains, brought about by, for example, electron beams, lasers, UV, heat or chemical additives.

The term "electronic assembly process" used herein refers to a process for the manufacture of an electronic device or component which also includes processes generally referred to as SMT.

The term "polymer" used herein typically refers to thermoplastic or thermosetting polymers.

The inventors have found that the composition exhibits improved mechanical strength and/or thermal fatigue resistance and/or barrier characteristics in comparison to compositions that do not contain a filler. In particular, the said composition may exhibit one or more of improved mechanical and thermal properties such as drop shock resistance, flexural bend resistance, thermal shock resistance, CTE, yield strength, fracture toughness, modulus, thermal cycling resistance and so on.

Such characteristics are particularly advantageous when the composition is used in a method of manufacturing an electronic device, since such characteristics may be transferred to the device. For example, the composition may be used in place of conventional underfill materials to reinforce (via encapsulation) solder joints formed between flip chip and organic circuit boards, which may experience thermomechanical strain as a result of the differing thermal expansions of the flip chip and organic printed circuit board.

The composition may be used in a solder paste as a solder flux. On heating the solder paste between two work pieces, a solder joint may be formed and the composition may cure and encapsulate the solder joint, thereby reinforcing the solder joint. Alternatively, the composition may be used, for example, in a conductive adhesive, where it is desired that the final adhesive bond exhibits high mechanical strength and/or thermal fatigue resistance.

The favorable mechanical and/or thermal fatigue properties may be exhibited by the composition at 100% collar or fillet heights or lower than 100% collar or fillet heights.

The flow dynamics and/or the cure kinetics of the polymer may advantageously prevent dislodging and possible transport of un-reflowed solder paste and may advantageously achieve higher Tg and favorable thermomechanical properties.

The polymer may be a curable polymer. The composition may be processed using a standard SMT line, and may be cured or set using standard SMT reflow processes and profiles. This is particularly advantageous since, unlike conventional underfill materials, it does not require separate and distinct processing steps during the electronic assembly process. Accordingly, an electronic assembly process using the composition of the present invention is simplified in comparison to an electronic assembly process using conventional underfill materials. The composition may be cured by, for example, heat, laser or UV. The composition is typically cured using heat, for example in a reflow oven along with solder paste. The temperature used is typically from 200 to 300° C., for example about 245° C. as peak temperature.

The composition is stable at room temperature, easily process-able and compatible with solder paste residues. The composition typically exhibits a paste-like or gel-like consistency.

The composition may be used for both low pressure and high pressure molding, over-molding, potting and encapsulation. The compositions may be used in concert with printed and/or deposited solder paste.

The composition has applications such as, for example, standard electronic assembly for manufacturing systems such as, for example, phones, computers, cameras, tablets and displays; semiconductor packaging; and assembly of similar systems such as, for example, PV modules and batteries.

Examples of the electronic assembly process include, for example, die attach, flip chip, package on board, ball grid array (BGA), surface mount technology (SMT) and LED manufacturing processes. The electronic assembly process is preferably a surface mount technology (SMT) process.

The filler is dispersed in the organic medium. In other words, the organic medium forms the continuous phase and the filler comprises the discontinuous phase.

The filler may be in the form of, for example, spheres, rods, platelets and/or flakes. The filler may have a largest dimension (or largest diameter when the filler is in the form of a sphere) of from 1 nm to 25 µm, for example from 1 to 100 nm, or from 1 to 10 nm, or from 0.1 to 25 µm, or from 1 to 5 µm (measured, for example, by SEM).

The composition may be in the form of a film, for example a B-stage film (i.e. a film in which the composition is partially cured). The film may be pre-applied to a work piece and may be formed around the work piece using stamping, e.g. hot stamping.

The composition is particularly beneficial when used in a flip chip LED attach method or a flip chip CSP (Chip-Scale Package) LED attach method.

When applied during flip-chip assembly on a substrate (Level 1), the composition may reinforce die attach interconnects (solder, sintered metal or even AuSn), thereby improving the reliability of the package. This reinforcement results in improvement in die shear values recorded after the assembly. The composition can also be applied during flip-chip or CSP package assembly on board (Level 2). The composition reinforces the package on board solder interconnects which results in an increase of the component shear values.

In conventional flip-chip attach methods, underfill material is used to reinforce flip-chip assemblies against the stresses that originate from the coefficient of thermal expansion (CTE) mismatch between the substrate and the die. However this approach suffers from many disadvantages. First, the stresses in the solder joints (from CTE mismatch between die and the substrate) are generated right after the assembly cools down are the solder joint reflow. The application of the underfill material after reflow only reinforces the joints against failure from the reflow stress and additional stresses that the assembly may encounter during temperature excursions during reliability testing and lifetime. This approach does not prevent the development of CTE mismatch stresses during the reflow step. Secondly, the underfill is applied after the die-attach (or package attach). It is usually dispensed around the edges of the die-substrate assembly. The underfill then travels around the solder joints by the capillary forces to fill in the space between die (or package) and the substrate. Unfortunately, the driving force from the capillary action is not sufficient enough to fill in the gap between the die and the substrate when the stand-off height (the height between the die and the substrate) is about 50 microns or less. Finally, once the underfill is filled in, the assembly is put in an oven to cure the underfill to achieve the desired properties for reinforcement of the solder joints. This extra underfill curing step may take an additional 1-2 hours.

Use of the composition of the present invention may overcome the disadvantages of the traditional underfill process. Since the composition is typically applied before the solder interconnects are made there is no limitation on the stand-off height between the die (or package) and the substrate. Assemblies with stand-off heights of 25 microns (or lower) can be easily reinforced. Secondly, since the composition cures during the solder reflow step (typically in a reflow oven), an extra curing step is not required. This increases the assembly throughput and reduces the cost of the process. Finally since the composition is already cured and locked in the assembly between or around the bumps, before the assembly cools down after the reflow, it counteracts the generation of the CTE mismatch stresses around the solder joints in the first place.

After formation of the solder joint, the composition of the present invention may cure into a low stress thermoset between or around the solder joint. During subsequent reflows, it holds the die down and effectively locks the solder into shape. This enables the assemblies with solder joints to survive multiple reflows without change in bond-line thickness or package tilt or float. The composition enables the use of traditional SAC based alloys for die-attach in applications that require many reflows without the yield loss associated with solder joint re-melting.

As flip-chip and CSP LEDs are getting smaller the gaps between the P/N pads are getting as small as 70-100 microns. In a conventional process, after reflow if the solder paste residue is not cleaned properly it results in current leakage during reliability testing at high temperature, humidity and reverse bias. Sometimes cleaning with stand-off heights less than 50 microns is not practical. Application of the composition of the present invention between the solder pads before reflow may eliminate current leakage during reverse bias testing. It may therefore bring significant reliability improvement to LED manufacturers without any additional cleaning step.

As flip-chip and CSP LEDs are getting smaller, their assembly with regular solder paste has become challenging due to the die (or package) tilt, float and rotation during reflow. As the solder melts during reflow its surface tension lifts up (and shifts) the die (or package) and the small weight of these components is not enough to hold the die in its place. The composition of the present invention, when applied on the solder pads before reflow, may provide the tackiness that counteracts the lateral surface tension forces from the molten solder. The composition may ensure that this counteracting force is just right to ensure anchoring of the component to the board without compromising the ability of the solder to wet the die and make the joint.

The composition comprises from 0.001 to 40 wt. % of the filler based on the total weight of the composition. Preferably, the composition comprises from 0.01 to 10 wt. % of the filler based on the total weight of the composition, more preferably from 0.02 to 5 wt. % of the filler based on the total weight of the composition, even more preferably from 0.03 to 4 wt. % of the filler based on the total weight of the composition, still even more preferably from 0.04 to 1 wt. % of the filler based of the total weight of the composition, still even more preferably from 0.04 to 0.8 wt. % of the filler based of the total weight of the composition, still even more preferably from 0.05 to 0.4 wt. % of the filler based of the total weight of the composition. In an alternative preferred embodiment, the composition comprises from 30 to 40 wt. % of the filler based of the total weight of the composition, preferably from 33 to 37 wt. % of the filler. Such a composition exhibits particularly favorable rheological properties. In another alternative preferred embodiment, the composition comprises from 0.1 to 4 wt. % of the filler based of the total weight of the composition. The composition may comprise at least 0.01 wt. % of the filler, preferably at least 0.02 wt. % of the filler, more preferably at least 0.03 wt. % of the filler, even more preferably at least 0.04 wt. %, still even more preferably at least 0.05 wt. % of the filler based on the total weight of the composition. The composition may comprise 20 wt. % or less of the filler, preferably 10 wt. % or less of the filler, more preferably 5 wt. % or less of the filler, even more preferably 4 wt. % or less of the filler, still even more preferably 1 wt. % or less of the filler, still even more preferably 0.8 wt. % or less of the filler, still even more preferably 0.4 wt. % or less of the filler based on the total weight of the composition. The presence of filler provides improved mechanical and/or thermal fatigue properties. Higher levels of filler may increase the viscosity of the pre-cured composition. Accordingly, the composition with low viscosity may be more easily applied to electronic devices and components that have small-sized features. This is particularly important for a surface-mount technology manufacturing method. Compositions with high viscosity may be more favorable for applications, such as printing, pin transfer and no flow adhesive composition for electronic assembly applications.

The typical viscosity of the composition prior to curing is from 12 to 20 Pa·s, more typically around 16 Pa·s at room temperature. The viscosity is measured by rheometer under constant shear rate of 10/s by using parallel plate geometry. The viscosity of the uncured composition may be low enough to enable the composition to be sprayed or jetted or dispensed. This may enable the composition to be used in conformal coating and strengthening of the whole board or assembly.

The composition is preferably a curable composition and/or the polymer is preferably a curable polymer.

The filler preferably comprises one or more of: graphene, graphene oxide, functionalized graphene, polyhedral oligomeric silsesquioxane and 2D materials. Once the polymer composition is cured, such species may provide the composition with particularly enhanced mechanical and/or thermal fatigue resistance properties. In particular, such species may provide the cured composition with increased drop shock resistance and impact bend strength in comparison to compositions containing no fillers or conventional fillers. Compositions containing such species may be useful as low coefficient of thermal expansion (CTE) adhesives for bonding work pieces with CTE mismatch. The cured compositions may also exhibit high hardness for scratch-resistance applications.

Only very low levels of filler, for example graphene and functionalized graphene, are required in order to provide such properties. Accordingly, compositions containing such species in low levels may exhibit both favorable mechanical and/or thermal fatigue properties while the uncured compositions may exhibit particularly low viscosities. The use of fillers such as graphene and/or functionalized graphene may improve the thermal stability of the resulting composition and may also increase the glass transition temperature (Tg) of the composition, thereby increasing the working limit of the composition.

The use of graphene oxide may reduce the amount of moisture that is able to penetrate the composition, thereby improving the hermiticity of the sealed packages/assemblies. The use of graphene and/or functionalized graphene may serve to remove/tie up free ions in the compositions, thereby improving the electrical properties of the final product.

The graphene may be mono layer, few layer or multi-layered graphene (MLG). The use of such graphene may enhance the electrical and/or thermal conductivity of the composition.

Polyhedral oligomeric silsesquioxanes (POSS) act as building blocks, because of the unique structure of the POSS macromer, which is a well-defined cluster with an inorganic silica-like core surrounded by eight organic corner groups. It is considered as the minimum silicate precursor, which forms silica after its oxidation. In the present invention, POSS is advantageously incorporated into the composition to overcome the shortage of traditional composites which cannot be dispersed in molecular level in materials. When the filler comprises POSS, the cured composition exhibits increased drop shock resistance and impact bend strength. The use of POSS may enhance the thermal conductivity of the material.

The filler preferably comprises: a polyhedral oligomeric silsesquioxane; and one or more of graphene and functionalized graphene (e.g. graphene oxide). This may provide the composition with a particularly low viscosity, and the composition with particularly favorable mechanical properties. The viscosity is typically lower, and the mechanical properties typically more favorable, compared with compositions in which an equivalent amount of only POSS or graphene/functionalized graphene is used. In other words, the combination of POSS with graphene and/or functionalized graphene (e.g. graphene oxide) surprisingly provides a synergistic effect. The use of POSS may reduce the amount of graphene/functionalized graphene required to achieve the desired properties.

Functionalizing graphene may help to control the surface properties of the graphene as well as stabilise exfoliated graphene layers for extended time in both solid and solution form. The advantages of using functionalized graphene over conventional graphene include, for example, improved mixing and dispersion and interaction with the polymer matrix, prevention of restacking of graphene layers in the polymer matrix and improved moisture and gas impermeability.

The filler preferably comprises functionalized graphene, wherein the functionalized graphene comprises graphene oxide. The use of graphene oxide may provide the composition with particularly favorable mechanical properties.

When the filler comprises a functionalized graphene, the functionalized graphene may be functionalized with an organic and/or an inorganic group, preferably one or more of: an amine group, a silane and/or titanate group, an epoxy group, an ester group and a polyhedral oligomeric silsesquioxane. The use of such functionalized graphenes may provide the composition with particularly favorable mechanical properties. The functionalized graphene may be advantageously functionalized with rubber molecules and/or flux functional groups. The functionalized graphene may be funtionalised with metal nanoparticles (i.e. particles having a longest dimension of from 1 to 500 nm), for example nanoparticles comprising one or more of silver, copper, gold and an alloy such as, for example, AgCu or AgAu. The use of such metal nanoparticles may enhance the electrical and/or thermal conductivities of the composition. The functionalized graphene may be functionalized with nanoparticles of metal oxide or metalloid oxide. The metal oxides may be oxides of, for example, an alkaline earth metal, a transition metal or a post transition metal. The use of such oxides may enhance moisture and gas impermeability of the composition and/or enhance thermal conductivity of the composition.

The graphene may be advantageously funtionalised with fluorine, for example fluorinated graphene, fluorinated graphene oxide or graphene oxide with fluorinated organic molecules attached to the basal $sp^2$ plane. Such fillers may render the composition substantially impermeable to both moisture and gases.

The filler preferably comprises a functionalized graphene, the functionalized graphene comprising graphene (and/or or graphene oxide) functionalized with a polyhedral oligomeric silsesquioxane. The use of such a filler may provide the composition with particularly low viscosity, and the cured composition with particularly favorable mechanical properties.

The filler may comprise boron nitride. Unlike graphene and other graphitic materials, the use of boron nitride does not alter the colour of the composition.

The polymer preferably comprises an epoxy resin, more preferably, the epoxy resin comprises different functionality epoxy resins and/or solid bifunctional (e.g. tri- or tetra-) epoxy resins, typically with high molecular weight. Such resins may exhibit high levels of cross-linking, thereby resulting in the cured composition exhibiting particularly favorable mechanical properties. The use of solid epoxy resins increases the solid content of the composition. Suitable polymers for use in the present invention include, for example, diglycedyl ether of bisphenol A, diglycedyl ether of bisphenol F, triglycedyl ether of para amino phenol, tetra glycedyl ether of diamino diphenyl sulphone, tetra glycedyl ether of di amino diphenyl methane, tetra glycedyl ether of di amino diphenyl ether, and tris (2,3-Epoxy propyl) Isocyanurate. The polymer may be a thermoplastic such as, for example, a polyolefin thermoplastic or an acrylic thermoplastic. The use of a thermoplastic may be advantageous when the composition is in the form of a film.

In a preferred embodiment:
the filler comprises graphene oxide, and
the composition comprises from 0.1 to 4 wt. % of the graphene oxide.

Such a composition may provide the composition with particularly favorable mechanical properties.

In this preferred embodiment, the organic medium preferably comprises:
from 30 to 40 wt. % of an organic solvent having a boiling point of at least 280° C.;
from 5 to 10 wt. % of different functionality epoxy resins;
from 15 to 30 wt. % of solid bifunctional epoxy resins, preferably with high molecular weight;
from 3 to 10 wt. % of an activator comprising a dicarboxylic acid;
from 2 to 8 wt. % of a catalyst comprising substituted aromatic amine;
from 1 to 5 wt. % of a catalyst comprising a phosphine-based salt;
from 1 to 5 wt. % of a liquid anhydride type hardener;
from 0.1 to 4 wt. % of a liquid type stress modifier; and
from 0.1 to 3 wt. % of an adhesion promoter.

Preferably, the organic medium further comprises an organic solvent, preferably having a boiling point of at least 280° C. The use of such a solvent may help to maintain a low viscosity of the composition and may help to provide stability to the final product. Suitable organic solvents having a boiling point of at least 280° C. for use in the present invention include, for example, butyl carbitol, diethylene glycol mono hexyl ether, and glycol ethers.

Preferably, the organic medium further comprises an activator, more preferably wherein the activator comprises a dicarboxylic acid. The activator may remove any oxidised layer on the surface to which the composition is applied (e.g. an electronic circuit board pad), and may increase the wetting performance of the solder paste with the composition.

Preferably, the organic medium further comprises a catalyst. The use of a catalyst may help the curable composition to undergo cross-linking. The catalyst preferably comprises a substituted aromatic amine and/or a phosphine-based salt. Such catalysts exhibit low reactivity. Accordingly, they may help to increase the room temperature stability of the composition, since they typically only undergo cross-linking at elevated temperatures.

Preferably, the organic medium further comprises a hardener, more preferably wherein the hardener comprises a liquid anhydride-type hardener. The presence of such a hardener may help to increase the room temperature stability of the composition by undergoing a cross-linking reaction with the epoxy resin only at elevated temperatures.

Preferably, the organic medium further comprises a stress modifier, preferably a liquid-type stress modifier. The use of a stress modifier may serve to reduce the brittleness of the epoxy resin.

The organic medium preferably further comprises an adhesion promoter. This may serve to increase the bonding between the composition and a solder joint.

In a preferred embodiment, the organic medium comprises:
from 30 to 40 wt. % of an organic solvent having a boiling point of at least 280° C.; and/or
from 5-10 wt. % of different functionality epoxy resins; and/or
from 15 to 30 wt. % of solid bifunctional epoxy resins, preferably with high molecular weight; and/or
from 3 to 10 wt. % of an activator comprising a dicarboxylic acid; and/or
from 2 to 8 wt. % of a catalyst comprising substituted aromatic amine; and/or
from 1 to 5 wt. % of a catalyst comprising a phosphine-based salt; and/or
from 1 to 5 wt. % of a liquid anhydride type hardener; and/or
from 0.1 to 4 wt. % of a liquid type stress modifier; and/or
from 0.1 to 3 wt. % of an adhesion promoter.

In a particularly preferred embodiment, the organic medium comprises:
about 39 wt. % of an organic solvent having a boiling point of at least 280° C.;
about 8 wt. % of different functionality epoxy resins;
about 29 wt. % of solid bifunctional epoxy resins, preferably with high molecular weight;
about 9 wt. % of an activator comprising a dicarboxylic acid;
about 3 wt. % of a catalyst comprising substituted aromatic amine;
about 4 wt. % of a catalyst comprising a phosphine-based salt;
about 2 wt. % of a liquid anhydride type hardener;
about 4 wt. % of a liquid type stress modifier; and
about 2 wt. % of an adhesion promoter.

The composition may be applied to a device using one or more of: film transfer, pin transfer, component dipping, paste dispensing, printing, spraying, casting and doctor-blading. Dipping height and dipping time can be varied to achieve different collar heights up to 100%.

The composition may be flow-able at high temperatures (for example, from 170 to 280° C.) using capillary additives.

The collar height of the composition may be varied up to 100% by varying the dipping height and/or dipping time. For example, the collar height may be varied from around 30% to up to 100%. Examples of suitable dipping heights and dipping times used to achieve varying collar heights are set out below in Table 1:

TABLE 1

Dipping conditions for achieving various collar heights.

|  | 50% dip | 70% dip | 90% dip | 125% dip | 150% dip | 175% dip |
|---|---|---|---|---|---|---|
| 0.3 sec | Collar = 20-30% | Collar = 20-30% | Collar = 30% | Collar = 50% | Collar = 70-80% | Collar = 100% |
| 1 sec | Collar = 20-30% | Collar = 30-40% | Collar = 40% | Collar = 50% | Collar = 90-100% | Collar = 90-100% |
| 5 sec | Collar = 20-30% | Collar = 20-30% | Collar = 100% | Collar = 100% | Collar = 100% | Collar = 90-100% |

In a preferred embodiment, the filler comprises graphene, graphene oxide, graphite flakes, graphene platelets, reduced graphene oxide, 2D materials or a combination of two or more thereof. This may provide the composition with high mechanical strength and/or high resistance to thermal fatigue.

The composition may comprise colour pigments. This may impart a desired colour to the cured composition.

In a further aspect, the present invention provides an underfill comprising the curable composition as described herein.

The underfill may be, for example, an edgefill, a cornerfill or an edge bond. In a preferred aspect, the underfill can be applied in one or more steps, preferably wherein the one or more steps comprises dipping and/or dispensing.

In a further aspect the present invention provides a solder flux comprising the composition as described herein.

In a further aspect the present invention provides a single or dual-side reinforcement (DSR) material comprising the curable composition as described herein.

In a further aspect the present invention provides an encapsulant comprising the composition as described herein.

In a further aspect the present invention provides a barrier material comprising the composition as described herein.

In a further aspect, the present invention provides an electronic material comprising:
  solder alloy; and
  the composition as described herein.

The solder alloy may be provided in the form of, for example, solder balls, a powder, a rod or a wire. The curable composition may at least partially coat the solder balls, the rod, the wire or the particles of the powder. The alloy may be, for example, a lead-free alloy, such as a SAC alloy.

In a further aspect, the present invention provides a conductive adhesive comprising:
  conductive particles; and
  the composition as described herein.

The conductive particles typically comprises metal (such as, for example, one or more of silver, copper and gold), alloy (such as, for example, a lead-free alloy, such as a SAC alloy) and/or particles coated with a metal and/or alloy. The conductive particles may be in the form of plates, rods and/or spheres. The conductive particles typically have a longest dimension (diameter if spherical) of the order of from 1 nm to 40 µm, for example from 1 to 500 nm. The conductive particles are dispersed in the polymer composition.

In a further aspect, the present invention provides a non-conductive adhesive comprising:
  non-conductive particles; and
  the composition as described herein The non-conductive particles typically comprises of metal or metalloid oxide, carbide, nitride (such as, for example, aluminum oxide, boron nitride, silicon carbide, aluminum nitride). The metal may be for example, an alkaline earth metal, a transition metal or a post transition metal.

The non-conductive particles may be in the form of plates, rods and/or spheres. The nonconductive particles typically have a longest dimension (diameter if spherical) of the order of from 1 nm to 40 µm, for example from 1 to 500 nm. The non-conductive particles are dispersed in the polymer composition In a further aspect the present invention provides a solder paste comprising:
  solder particles; and
  the composition as described herein.

The solder particles typically comprises metal (such as, for example, one or more of silver, copper and gold), alloy (such as, for example, a lead-free alloy, such as a SAC-type alloy) and/or particles coated with a metal and/or alloy. The solder particles may be in the form of plates, rods and/or spheres. The solder particles typically have a longest dimension (diameter if spherical) of from 1 nm to 40 µm, for example from 1 to 500 nm. The solder particles are dispersed in the polymer composition.

The composition, solder flux, electronic material, conductive adhesive, solder paste, underfill, reinforcement (DSR) material, encapsulant and/or barrier material of the present invention may comprise a lead-free, zero-halogen no-clean solder paste, for example LUMET™ P39 (ALPHA®).

In a further aspect, the present invention provides a solder joint at least partially encapsulated with a composition, the composition being the curable polymer composition as described herein. The solder joint is typically substantially encapsulated with the cured polymer composition, more typically completely encapsulated with the cured polymer composition.

In a further aspect, the present invention provides a method of forming a solder joint, the method comprising:
  providing the solder paste as described herein between two or more work pieces to be joined; and
  heating the solder paste to form a solder joint.

The solder paste is typically heated to a temperature of 170 to 280 degree C.

In a further aspect, the present invention provides a method of manufacturing the composition as described herein, the method comprising:
  providing an organic medium comprising a polymer; and
  dispersing a filler in the organic medium,
  wherein:
    the filler comprises one or more of graphene, 2D materials, functionalized graphene, graphene oxide, a polyhedral oligomeric silsesquioxane, graphite, aluminum oxide, zinc oxide, aluminum nitride, boron nitride, silver, nano fibers, carbon fibers, diamond, carbon nanotubes, silicon dioxide and metal-coated particles, and
    the composition comprises from 0.001 to 40 wt. % of the filler based on the total weight of the composition.

Prior to having the filler dispersed therein, the components of the organic medium are typically mixed at a temperature of up to 150° C., more typically from 50 to 120° C., even more typically about 90° C., to form a homogeneous mixture. The organic medium is then typically milled, for example using a three roll mill. After confirmation of FOG<10 micron, the milling process is typically stopped. Dispersing the filler in the organic medium may comprise mechanical blending.

In a further aspect, the present invention provides use of the composition described herein in a method selected from: an electronic assembly method, a surface-mount technology (SMT) method, a die attachment method, a reflow soldering method, a circuit board manufacturing method and a solar cell manufacturing method.

In a further aspect, the present invention provides use of the composition described herein in electronic packaging, flip chips, LED assembly and hermetic sealing.

In a further aspect, the present invention provides use of graphene and/or functionalized graphene to increase the flow-ability of a composition.

In a further aspect, the present invention provides a composition comprising a filler dispersed in an organic medium, the organic medium comprising a curable polymer, wherein:

the filler comprises one or more of graphene, 2D materials, functionalized graphene, graphene oxide, a polyhedral oligomeric silsesquioxane, graphite, aluminum oxide, zinc oxide, aluminum nitride, boron nitride, silver, nano fibers, carbon fibers, diamond, carbon nanotubes, silicon dioxide and metal-coated particles, and the composition comprises from 0.001 to 40 wt. % of the filler based on the total weight of the composition.

The composition may be, for example, for use as a solder flux, or for use in a conductive adhesive, or for use as an underfill material, or for use in the manufacturing of electronic devices, or for use in the reinforcing of solder joints, or for use as a single or dual side reinforcement material (DSR), or for use as an encapsulant, or for use as an adhesive, or for use as a barrier material (e.g. a material to prevent ingress into, for example, a solder joint).

In a further aspect the present invention provides a composition for use in a surface-mount process, the composition comprising a filler dispersed in an organic medium, wherein:

the organic medium comprises a polymer;

the filler comprises one or more of graphene, functionalized graphene, graphene oxide, a polyhedral oligomeric silsesquioxane, graphite, a 2D material, aluminum oxide, zinc oxide, aluminum nitride, boron nitride, silver, nano fibers, carbon fibers, diamond, carbon nanotubes, silicon dioxide and metal-coated particles, and the composition comprises from 0.001 to 40 wt. % of the filler based on the total weight of the polymer composition.

In a further aspect, the present invention provides use of a filler to provide a composition with a viscosity of from 12 to 20 Pa·s and one or more of improved mechanical strength, improved thermal fatigue resistance and improved barrier characteristics, the filler comprising one or more of graphene, functionalized graphene, graphene oxide, a polyhedral oligomeric silsesquioxane, graphite, a 2D material, aluminum oxide, zinc oxide, aluminum nitride, boron nitride, silver, nano fibers, carbon fibers, diamond, carbon nanotubes, silicon dioxide and metal-coated particles.

In a further aspect, the present invention provides use of the composition as described herein in an electronic assembly application such as printing, pin transfer and no flow adhesive composition, the composition having a viscosity of greater than 20 Pa·s. As discussed above, such applications benefit from a higher viscosity. The higher viscosity may be provided by, for example, increasing the level of filler.

In a further aspect, the present invention provides use of a filler to control the coefficient of thermal expansion (CTE) of a composition, the filler comprising one or more of graphene, functionalized graphene, graphene oxide, a polyhedral oligomeric silsesquioxane, graphite, a 2D material, aluminum oxide, zinc oxide, aluminum nitride, boron nitride, silver, nano fibers, carbon fibers, diamond, carbon nanotubes, silicon dioxide and metal-coated particles. Controlling the CTE may enhance the thermal fatigue life of the composition.

The invention will now be described with reference to the following non-limiting drawings, in which.

Figure 1:
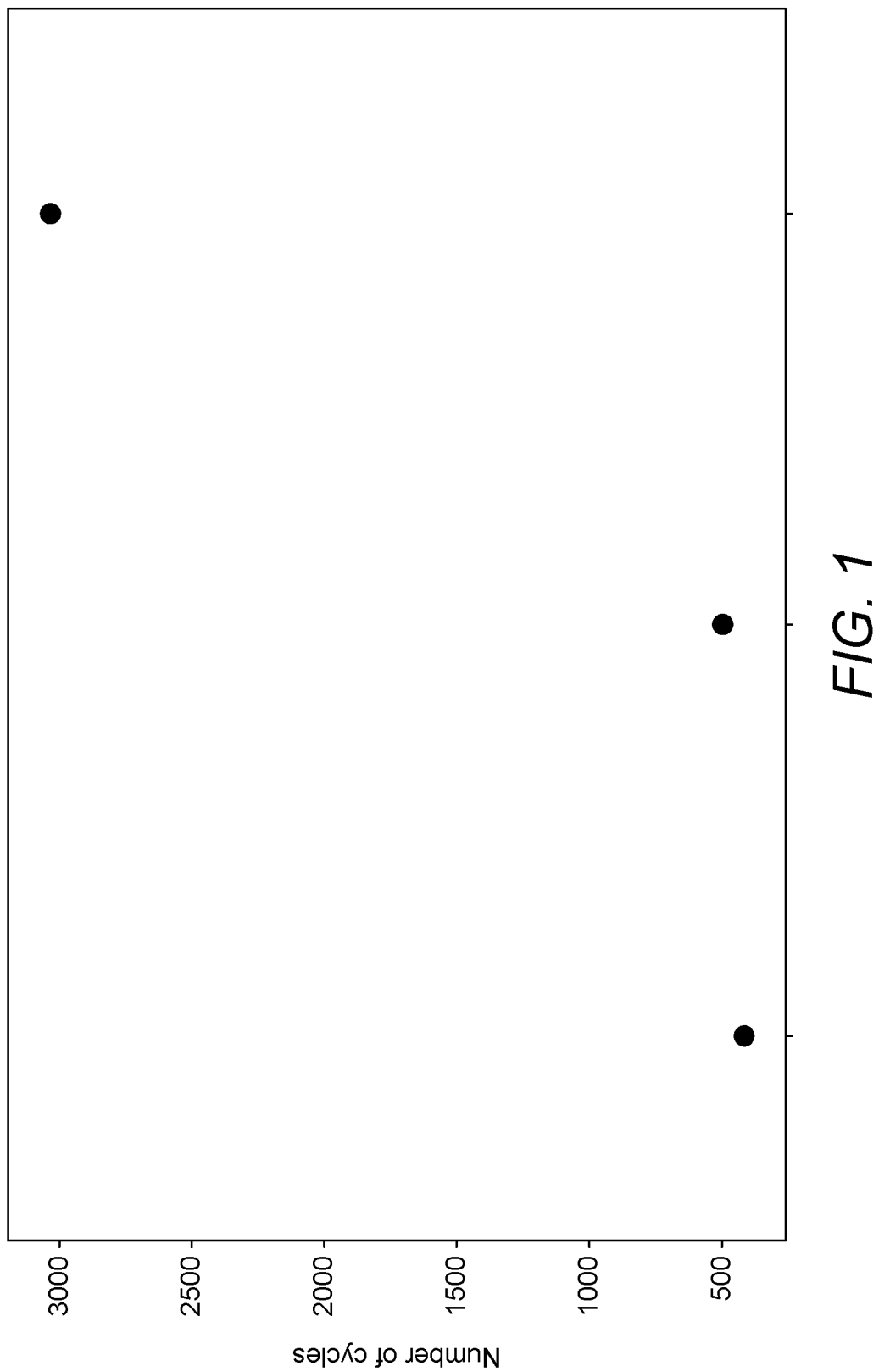
FIG. 1 is a plot showing the results of impact bending testing for a number of compositions according to the present invention.

The invention will now be described in relation to the following non-limiting example.

EXAMPLE 1

Graphite oxide was prepared from natural flake graphite using a modified Hummers method. Commercially available graphite powder and 10 g of sodium nitrate was added to 500 mL of conc. (98%) sulphuric acid with stirring and was then kept in an ice-bath. 10 g of Graphite powder (300 mesh) was then added to it slowly after 15 min and was stirred for 10 min to have a homogeneous mixture. 67 g of potassium permanganate was added to it very slowly and carefully while stirring the whole reaction mixture in an ice-bath. After ~30 min the whole reaction mixture was transferred on a hot plate set kept at ~40° C. It was then stirred for ~2.5 h until the colour of the reaction mixture became reddish. It was then allowed to cool down at room temperature for ~30 min. After that 500 mL deionised water was added to it very slowly while stirring. After 10-15 min of stirring, 1 L of warm deionised water and followed by 100 ml 30 vol % hydrogen peroxide was added to the reaction mixture and stirred for ~5 min. The final product was isolated via centrifugation performed at 4000 rpm for 8 min duration and it was washed then thoroughly and rigorously with deionised water in the same centrifugation condition. This step was repeated almost ~20 times in order to discard all the un-reacted chemicals, by products as well as to make pH close to ~7. It was then washed with acetone 3-4 times and kept in an oven set at 65° C. for complete drying. Graphite oxide powder was then obtained in solid form and ready for further use.

An organic medium was then prepared comprising:
a) Organic solvents with high boiling points 39 wt %
b) Different functionality epoxy resins 8 wt %
c) Solid epoxy resin with high molecular weight and bi-functional 29%
d) Di carboxylic acid as an activator 9 wt. %
e) Substituted aromatic amine as catalyst 3 wt. %
f) Phosphine based salt as catalyst 4 wt. %
g) Liquid anhydride type hardener/catalyst 2 wt %
h) Liquid type stress modifier 4 wt %
i) Adhesion promoters 2 wt %

All the above species (a)-(i) were mixed in the required ratio and heated to 90° C. until a homogeneous mixture was obtained. The mixture was then subjected to three roll milling. After having confirmation of FOG<10 micron, the milling process was stopped. The graphite oxide powder was then dispersed in the organic medium using mechanical blending to provide a curable composition comprising 0.1 to 4 wt. % graphene oxide.

Thermal Cycling Testing:

The composition was mixed with solder particles to form a solder paste. A solder paste was also prepared using the above composition but without the presence of a filler (comparative example). The solder pastes were used to form solder joints on printed circuit boards using an SMT method.

Thermal cycling testing was carried out using the following procedure:

Equipment:
Espec thermal cycling chamber (Air-Air) ISA-101S.
Agilent 34980A datalogger.
Test Conditions:
Test according to IPC 9701-A standard.
−40° C. (10 min) to +125° C. (10 min) for 1000 cycles.
Failure Definition:
As per IPC 9701-A: 20% increase in nominal resistance (within a maximum of 5 consecutive reading scans).
Failure Analysis:
Cross-section after 240, 500, 750 and 1000 cycles, and microscopic analysis.

The results are set out in Table 2 below.

TABLE 2

Thermal cycling results.

| Solder Paste | % Failures | | | |
|---|---|---|---|---|
| | <250 cycles | <500 cycles | <750 cycles | <1000 cycles |
| Comparative Example | 6.7 | 11.1 | 13.3 | 13.3 |
| Example 1 | 2.3 | 2.3 | 4.5 | 4.5 |

It can be seen that the composition of the present invention exhibits improved thermal cycling resistance characteristics in comparison to a composition containing no filler.

Impact Bending Testing:
Impact bending testing was carried out using the following procedure:
Test Conditions:
Connect test vehicle to a datalogger.
Use fixed board deflection as 1.2 mm.
Test till first failure.
Impact striking point on component: In the corner of the component.
Impact striking pin shape: Rounded (10 mm Ø).
Test Vehicles:
Surface Finish: EniG.
50×50 mm, 0.8 mm thickness.
Component: BGA84.
Failures Definition:
Increase of 200Ω in the electrical resistance.

The results are shown in FIG. 1. It can be seen that the composition of Example 1 (right hand side) exhibited greater impact bending resistance compared to comparative examples (left and middle), in which the composition did not contain any filler.

Drop Shock Resistance Testing:
Drop shock resistance testing was carried out using the following procedure:
Equipment
Lansmont HC18 Shock Tester.
Lansmont TP4.
AnaTech Event Detector.
Test Conditions
Follows JEDEC standard JESD22-B111 "Board Level Drop Test Method of Components for Handheld Electronic Products".
Uses service condition B (1500 Gs, 0.5 msec pulse, half-sine curve).

Figure 2:
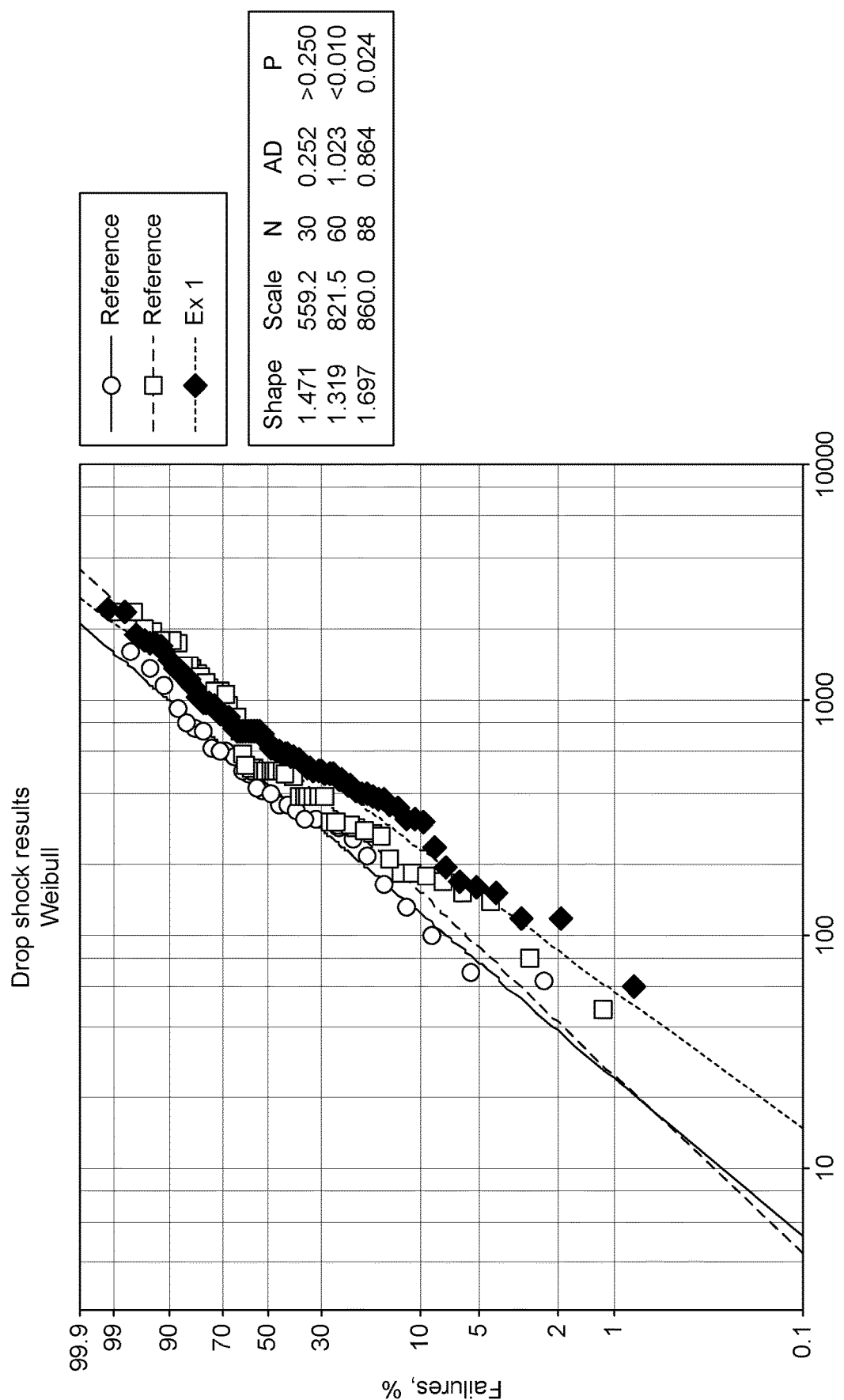
FIG. 2 is a plot showing the results of drop shock resistance testing for a number of compositions according to the present invention.

The drop shock resistance of Example 1 was found to be greater than that of comparative examples containing no filler, or conventional filler. Results of drop shock resistance testing are shown in FIG. 2 (diamonds: present invention, square/circles: reference examples).

The foregoing detailed description has been provided by way of explanation and illustration, and is not intended to limit the scope of the appended claims. Many variations in the presently preferred embodiments illustrated herein will be apparent to one of ordinary skill in the art and remain within the scope of the appended claims and their equivalents.

The invention claimed is:

1. A composition for use in an electronic assembly process, the composition comprising a filler dispersed in an organic medium, wherein:
the organic medium comprises:
from 30 to 40 wt. % of an organic solvent having a boiling point of at least 280° C.;
from 5 to 10 wt. % of different functionality epoxy resins;
from 15 to 30 wt. % of solid bifunctional epoxy resins;
from 3 to 10 wt. % of an activator comprising a dicarboxylic acid;
from 2 to 8 wt. % of a catalyst comprising substituted aromatic amine;
from 1 to 5 wt. % of a catalyst comprising a phosphine-based salt;
from 1 to 5 wt. % of a liquid anhydride type hardener;
from 0.1 to 4 wt. % of a liquid type stress modifier; and
from 0.1 to 3 wt. % of an adhesion promoter;
the filler comprises one or more of graphene, functionalized graphene, graphene oxide, a polyhedral oligomeric silsesquioxane, graphite, a 2D material, aluminum oxide, zinc oxide, aluminum nitride, boron nitride, silver, nano fibers, carbon fibers, diamond, carbon nanotubes, silicon dioxide and metal-coated particles, and
wherein the composition comprises from 0.03 to 4.0 wt. % of the filler based on the total weight of the composition.

2. The composition of claim 1 comprising 0.04 to 1.0 wt. % of the filler based of the total weight of the composition.

3. The composition of claim 1, comprising from 0.05 to 0.4 wt. % of the filler based of the total weight of the composition.

4. The composition according to claim 1, wherein the filler comprises one or more of: graphene, graphene oxide, functionalized graphene and a polyhedral oligomeric silsesquioxane.

5. The composition according to claim 4, wherein the filler comprises:
a polyhedral oligomeric silsesquioxane; and
one or more of graphene, and functionalized graphene.

6. The composition according to claim 4, wherein the filler comprises functionalized graphene, the functionalized graphene comprising one or more of an amine group, a silane and/or titanate group, an epoxy group, an ester group and a polyhedral oligomeric silsesquioxane.

7. The composition according to claim 1, wherein the organic medium comprises:
about 39 wt. % of an organic solvent having a boiling point of at least 280° C.;
about 8 wt. % of different functionality epoxy resins;
about 29 wt. % of solid bifunctional epoxy resins with high molecular weight;

about 9 wt. % of an activator comprising a dicarboxylic acid;
about 3 wt. % of a catalyst comprising substituted aromatic amine;
about 4 wt. % of a catalyst comprising a phosphine-based salt;
about 2 wt. % of a liquid anhydride type hardener;
about 4 wt. % of a liquid type stress modifier; and
about 2 wt. % of an adhesion promoter.

8. The composition according claim 1, wherein the composition is flowable at high temperatures using capillary additives.

9. The composition according to claim 1, wherein a collar height of the composition, when cured, may be varied up to 100% by varying dipping height and/or dipping time.

10. The composition according to claim 1, wherein the composition further comprises color pigments.

11. The composition according to claim 1, wherein the composition has a viscosity of from 12 to 20 Pas.

12. The composition according to claim 1, wherein the filler controls the coefficient of thermal expansion (CTE) of the composition.

13. A method of forming a solder joint, the method comprising:
(i) providing a solder paste between two or more work pieces to be joined, wherein the solder paste comprises:
(a) solder particles; and
(b) the composition according to claim 1; and
(ii) heating the solder paste to form a solder joint.

14. The method of forming a solder joint according to claim 13, wherein the solder joint is at least partially encapsulated with a cured polymer composition.

15. The method of claim 13, wherein the step of providing the solder paste between two or more work pieces to be joined comprises applying the solder paste to at least one of the work pieces, wherein the paste is in the form of a film, and wherein heating the solder paste comprises hot stamping.

16. The method according to claim 13, wherein the filler controls the coefficient of thermal expansion (CTE) in the composition.

17. An underfill composition, the composition comprising a filler dispersed in an organic medium, wherein:
the organic medium comprises:
from 30 to 40 wt. % of an organic solvent having a boiling point of at least 280° C.;
from 5 to 10 wt. % of different functionality epoxy resins;
from 15 to 30 wt. % of solid bifunctional epoxy resins;
from 3 to 10 wt. % of an activator comprising a dicarboxylic acid;
from 2 to 8 wt. % of a catalyst comprising substituted aromatic amine;
from 1 to 5 wt. % of a catalyst comprising a phosphine-based salt;
from 1 to 5 wt. % of a liquid anhydride type hardener;
from 0.1 to 4 wt. % of a liquid type stress modifier; and
from 0.1 to 3 wt. % of an adhesion promoter;
the filler comprises one or more of graphene, functionalized graphene, graphene oxide, a polyhedral oligomeric silsesquioxane, graphite, a 2D material, aluminum oxide, zinc oxide, aluminum nitride, boron nitride, silver, nano fibers, carbon fibers, diamond, carbon nanotubes, silicon dioxide and metal-coated particles, and
wherein the composition comprises from 0.03 to 4.0 wt. % of the filler based on the total weight of the composition.

18. The underfill of claim 17, wherein the underfill can be applied in one or more steps, wherein the one or more steps comprise dipping and/or dispensing.

* * * * *